(12) United States Patent
Christiansen et al.

(10) Patent No.: US 10,645,845 B2
(45) Date of Patent: May 5, 2020

(54) FORCED FLOW COOLING TEMPERATURE CONTROL METHOD, SYSTEM, AND APPARATUS

(71) Applicants: Martin Brokner Christiansen, Laurel, MD (US); Stanley Katsuyoshi Wakamiya, Ellicott City, MD (US); Elie K. Track, Stamford, CT (US); Steven Ward Van Sciver, Easton, PA (US); Kelsey McCusker, Sparrows Point, MD (US)

(72) Inventors: Martin Brokner Christiansen, Laurel, MD (US); Stanley Katsuyoshi Wakamiya, Ellicott City, MD (US); Elie K. Track, Stamford, CT (US); Steven Ward Van Sciver, Easton, PA (US); Kelsey McCusker, Sparrows Point, MD (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 289 days.

(21) Appl. No.: 15/951,913

(22) Filed: Apr. 12, 2018

(65) Prior Publication Data
US 2019/0320557 A1 Oct. 17, 2019

(51) Int. Cl.
*H05K 7/20* (2006.01)
*H05K 7/14* (2006.01)
(Continued)

(52) U.S. Cl.
CPC ........... *H05K 7/20518* (2013.01); *F25B 9/00* (2013.01); *H05K 7/026* (2013.01); *H05K 7/1427* (2013.01);
(Continued)

(58) Field of Classification Search
CPC ......... H01L 23/473; H01L 2225/06589; H01L 25/0657; H01L 23/34; H01L 23/46;
(Continued)

(56) References Cited

U.S. PATENT DOCUMENTS 4,962,444 A 10/1990 Niggemann
5,268,815 A 12/1993 Cipolla et al.
(Continued)

FOREIGN PATENT DOCUMENTS

DE 10138711 A1 4/2002
EP 2400828 A1 12/2011
(Continued)

OTHER PUBLICATIONS

Iversen A Ed—Institute of Electrical and Electronics Engineers: "Next Generation Power Electronics for Space and Aircraft. / Part II—Packaging", Aerospace Power Systems. Boston, Aug. 4-9, 1991 ; [Proceedings of the Intersociety Energy Conversion Engineering Conference], New York, IEEE, US, vol. 1, Aug. 4, 1991 (Aug. 4, 1991), pp. 177-182, XP000280446, ISBN: 978-0-89448-163-5, p. 179, column 2, p. 181, cols. 1-2, figures 6-8.
(Continued)

*Primary Examiner* — Adam B Dravininkas
(74) *Attorney, Agent, or Firm* — Tarolli, Sundheim, Covell & Tummino LLP (57) ABSTRACT

An apparatus for providing forced flow cooling in a circuit card environment is provided includes at least one circuit card including first and second longitudinally spaced circuit card subassemblies, connected together into a single circuit card oriented substantially in a lateral-longitudinal plane. The first and second circuit card subassemblies have first and second operating temperatures, which are different from one another. A housing defines a housing internal volume which completely three-dimensionally surrounds the circuit
(Continued)

card. A first temperature-control fluid is directed laterally across at least a portion of the first circuit card subassembly within the housing internal volume in a first flow path to induce the first operating temperature concurrently with a second temperature-control fluid being directed laterally across at least a portion of the second circuit card subassembly within the housing internal volume in a second flow path to induce the second operating temperature.

21 Claims, 8 Drawing Sheets

(51) Int. Cl.
    *H05K 7/02*     (2006.01)
    *F25B 9/00*     (2006.01)

(52) U.S. Cl.
    CPC ......... *H05K 7/203* (2013.01); *H05K 7/20327* (2013.01); *H05K 7/20636* (2013.01)

(58) Field of Classification Search
    CPC ... H01L 23/467; H01L 23/49827; G06F 1/20; G06F 2200/201; G06F 1/183; G06F 1/185; G06F 1/206; G06F 1/203; H05K 7/20772; H05K 7/20636; H05K 7/20254; H05K 7/20272; H05K 7/1404; H05K 7/20154; H05K 7/20218; H05K 7/20781; H05K 7/20927; H05K 7/20518; H05K 7/026; H05K 7/20327; H05K 7/203; H05K 7/1427; H05K 7/20372; F25B 9/00
    See application file for complete search history.

(56) References Cited

U.S. PATENT DOCUMENTS

| | | | |
|---|---|---|---|
| 6,285,564 B1 | 9/2001 | O'Brien | |
| 6,616,469 B2 | 9/2003 | Goodwin et al. | |
| 6,713,854 B1 | 3/2004 | Kledzik et al. | |
| 7,190,060 B1 | 3/2007 | Chiang | |
| 7,609,523 B1 | 10/2009 | Ni et al. | |
| 8,780,556 B1 | 7/2014 | Ditri | |
| 9,648,749 B1 | 5/2017 | Christiansen | |
| 10,365,436 B2 | 7/2019 | Byrd et al. | |
| 2002/0127900 A1* | 9/2002 | Goodwin | H05K 7/20636 439/196 |
| 2002/0187590 A1 | 12/2002 | Bolken et al. | |
| 2004/0041166 A1 | 3/2004 | Morrison | |
| 2005/0061541 A1 | 3/2005 | Belady | |
| 2005/0168949 A1* | 8/2005 | Tilton | H01L 23/4735 361/699 |
| 2008/0007913 A1* | 1/2008 | Sullivan | H05K 7/20636 361/699 |
| 2008/0032456 A1 | 2/2008 | Ahn et al. | |
| 2008/0239683 A1 | 10/2008 | Brodsky et al. | |
| 2011/0069454 A1* | 3/2011 | Campbell | H05K 7/2079 361/700 |
| 2011/0075377 A1 | 3/2011 | Paquette et al. | |
| 2012/0020024 A1* | 1/2012 | Dunwoody | H05K 7/20781 361/702 |
| 2012/0140421 A1 | 6/2012 | Kirstine | |
| 2013/0333414 A1 | 12/2013 | Inaba et al. | |
| 2014/0268594 A1 | 9/2014 | Wang et al. | |
| 2014/0340845 A1* | 11/2014 | Straznicky | H05K 7/20145 361/689 |
| 2016/0073548 A1 | 3/2016 | Wei et al. | |
| 2017/0142820 A1* | 5/2017 | Christiansen | H05K 7/20372 |

FOREIGN PATENT DOCUMENTS

| | | |
|---|---|---|
| JP | 7-7188 A | 1/1995 |
| JP | 2007049015 A | 2/2007 |
| JP | 2010186846 A | 8/2010 |

OTHER PUBLICATIONS

International Search Report and Written Opinion for PCT/US2019/024857 dated Jul. 22, 2019.
Japanese Office Action corresponding to JP Patent No. 2018-525552, pp. 1-3, dated May 29, 2019.
Korean Office Action corresponding to Korean Patent Application No. 10-2018-7013967, pp. 1-6, dated Jun. 24, 2019.
International Search Report and Written Opinion corresponding to PCT/US2019/018766, pp. 1-16, dated May 22, 2019.
International Search Report and Written Opinion corresponding to PCT/US2019/024366, pp. 1-15, dated Jul. 4, 2019.
Kawai, J. et al.: "Fabrication of Superconducting Quantum Interference Device Magnetometers on a Glass Epoxy Polyimide Resin Substrate With Copper Terminals," Physics Procedia, NL, 2012, vol. 36, pp. 262-267.
Japanese Office Action corresponding to Japanese Application No. 2018-525559 dated Apr. 8, 2019.

* cited by examiner

FORCED FLOW COOLING TEMPERATURE CONTROL METHOD, SYSTEM, AND APPARATUS

TECHNICAL FIELD

This disclosure relates to a temperature control method, system, and apparatus and, more particularly, to an apparatus, system, and method for providing forced flow cooling in a circuit card environment.

BACKGROUND

A circuit card is the current state of the art for building assemblies of electronic devices including a plurality of integrated circuits ("chips"). These assemblies can be separated into multiple types: organic multilayer laminated printed wire board (PWB), low temperature co-fired ceramic (LTCC), and high temperature co-fired ceramic (HTCC). Using each of these technologies, circuit card assemblies have been fabricated.

In a superconducting supercomputer, many of the operating processing integrated circuits ("chips") are cooled to about 4 K, but certain of the memory chips instead have a much warmer operating temperature of about 77 K. Providing cooling at 4 K is a costly activity, so every effort is made in superconducting supercomputer design to reduce the thermal parasitic load. This includes placing the assembly in vacuum (no convection), use of coatings and multilayer insulation to reduce thermal radiation, and limiting the conductive thermal load between the "hot side" and "cool side" of the entire assembly.

For large scale applications, the state of the art currently solves the problem of achieving the desired operating temperatures for a superconducting supercomputer by utilizing a large centralized refrigeration plant. Such a system supplies liquid coolant (helium at 4 K or nitrogen at 77 K). The thermal parasitic load is minimized by using separate cryogenic vessels or dewars for each of the temperature regimes. A 4 K dewar is maintained with liquid helium and a 77 K dewar may contain liquid nitrogen. Signals between the two temperature sides are completed by cabling. This solution requires cables that are long from a digital perspective, which results in significant latency between the 4 K and 77 K regions and may require more parts in the 4 K stage. These additional parts consume significant power and make certain designs of superconducting supercomputers infeasible.

In small scale applications, a cryocooler or closed cycle refrigerator can be used to provide cooling at both temperatures. By this method, the first stage of the cryocooler provides an approximate 77 K platform while the final stage of the cryocooler provides a 4 K stage. Connections between the two zones are completed by cabling. While this brings the two temperature sides closer together, this approach is not scalable to large applications because the heat removal of the cryocooler is insufficient.

SUMMARY

In an embodiment, an apparatus for providing forced flow cooling in a circuit card environment is provided. The apparatus includes at least one circuit card including first and second longitudinally spaced circuit card subassemblies, connected together into a single circuit card oriented substantially in a lateral-longitudinal plane. The first and second circuit card subassemblies are connected together by a laterally extending card connector oriented in a parallel lateral-longitudinal plane to the first and second circuit card subassemblies. The first and second circuit card subassemblies have first and second operating temperatures, respectively. The first and second operating temperatures are different from one another. A housing defines a housing internal volume which completely three-dimensionally surrounds the circuit card. A first temperature inlet coupling is provided for routing a first temperature-control fluid into the housing. The first temperature inlet coupling is laterally aligned with the first circuit card subassembly. A first temperature outlet coupling is provided for routing the first temperature-control fluid out of the housing. The first temperature outlet coupling is laterally aligned with the first circuit card subassembly and is longitudinally spaced upon the housing from the first temperature inlet coupling. A second temperature inlet coupling is provided for routing a second temperature-control fluid into the housing. The second temperature inlet coupling is laterally aligned with the second circuit card subassembly. A second temperature outlet coupling is provided for routing the second temperature-control fluid out of the housing. The second temperature outlet coupling is laterally aligned with the second circuit card subassembly and is longitudinally spaced upon the housing from the second temperature inlet coupling. The first temperature-control fluid is directed laterally across at least a portion of the first circuit card subassembly within the housing internal volume in a first flow path to induce the first operating temperature concurrently with the second temperature-control fluid being directed laterally across at least a portion of the second circuit card subassembly within the housing internal volume in a second flow path to induce the second operating temperature.

In an embodiment, a method of providing forced flow cooling in a circuit card environment is provided. An apparatus is provided, the apparatus including at least one circuit card including first and second longitudinally spaced circuit card subassemblies, connected together into a single circuit card oriented substantially in a lateral-longitudinal plane. The first and second circuit card subassemblies are connected together by a laterally extending card connector oriented in a parallel lateral-longitudinal plane to the first and second circuit card subassemblies. A housing defines a housing internal volume. A first temperature inlet coupling is laterally aligned with the first circuit card subassembly. A first temperature outlet coupling is laterally aligned with the first circuit card subassembly and is longitudinally spaced upon the housing from the first temperature inlet coupling. A second temperature inlet coupling is laterally aligned with the second circuit card subassembly. A second temperature outlet coupling is laterally aligned with the second circuit card subassembly and is longitudinally spaced upon the housing from the second temperature inlet coupling. The first circuit card subassembly is configured for operation at a first operating temperature. The second circuit card subassembly is configured for operation at a second operating temperature which is different from the first operating temperature. The circuit card is completely surrounded with the housing internal volume. A first temperature-control fluid is routed into the housing through the first temperature inlet coupling. The first temperature-control fluid is routed out of the housing through the first temperature outlet coupling. A second temperature-control fluid is routed into the housing through the second temperature inlet coupling. The second temperature-control fluid is routed out of the housing through the second temperature outlet coupling. The first temperature-control fluid is directed laterally across at least a portion of the first circuit card subassembly within the housing internal volume in a first flow path. The second temperature-control fluid is directed laterally across at least a portion of the second circuit card subassembly within the housing internal volume in a second flow path. The first operating temperature is induced via the first flow path concurrently with the second operating temperature being induced via the second flow path.

BRIEF DESCRIPTION OF THE DRAWINGS

For a better understanding, reference may be made to the accompanying drawings, in which.

DESCRIPTION OF ASPECTS OF THE DISCLOSURE

This technology comprises, consists of, or consists essentially of the following features, in any combination.

Figure 1:
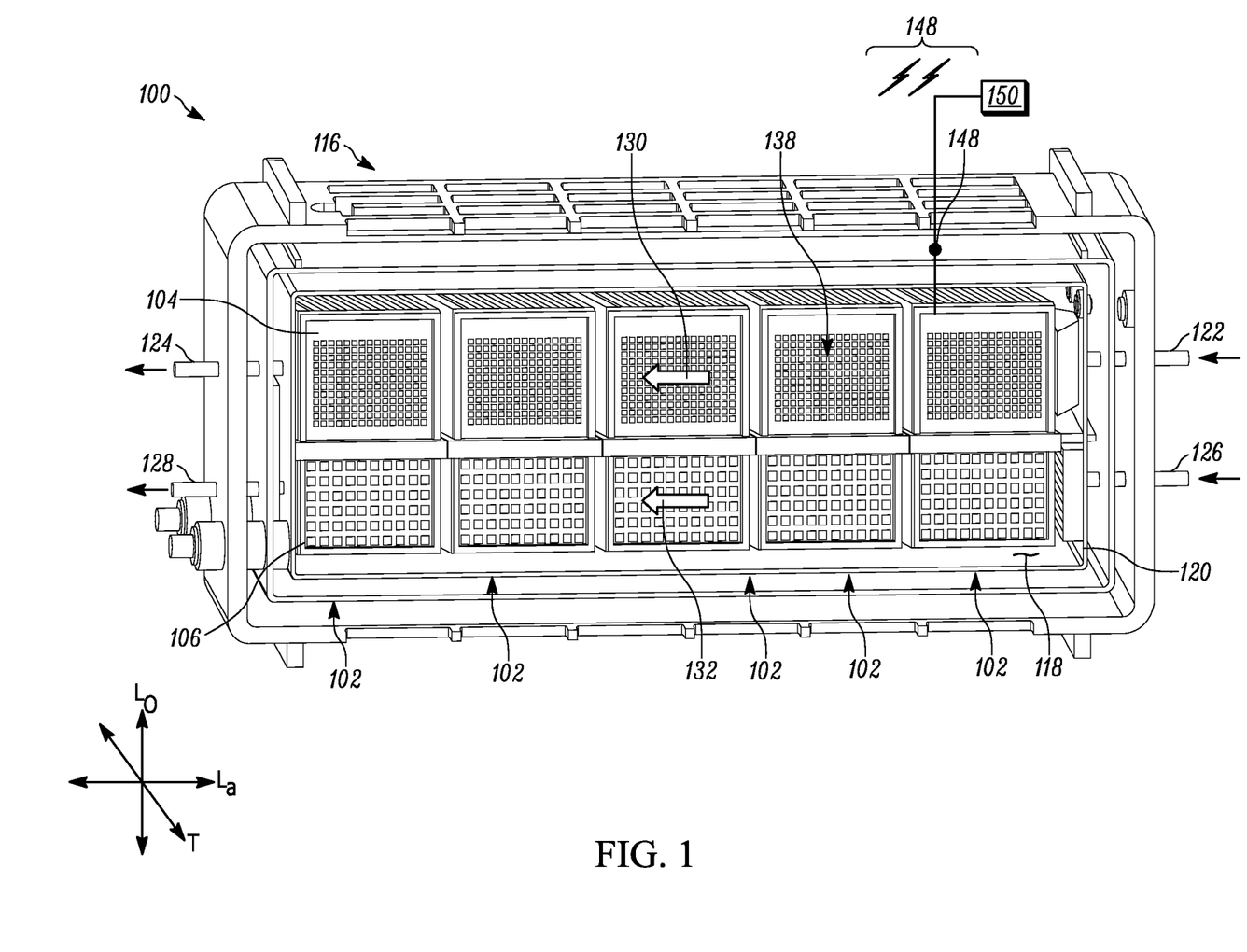
FIG. 1 is a schematic partial front view of one aspect of the invention.

FIG. 1 depicts an apparatus 100 for providing forced flow cooling in a circuit card environment. The apparatus 100 includes at least one circuit card 102 including first and second longitudinally spaced circuit card subassemblies 104 and 106, respectively. The first and second circuit card subassemblies 104 and 106 are connected together into a single circuit card 102 oriented substantially in a lateral-longitudinal plane which is somewhat coincident with the plane of the page in FIG. 1 (as shown by orthogonal lines Lo and La), other than as tilted to allow for the perspective view of that Figure. The first and second circuit card subassemblies 104 and 106 are connected together by a laterally extending card connector 208 oriented in a parallel lateral-longitudinal plane to the first and second circuit card subassemblies 104 and 106. This arrangement is shown in FIG. 2.

Figure 2:
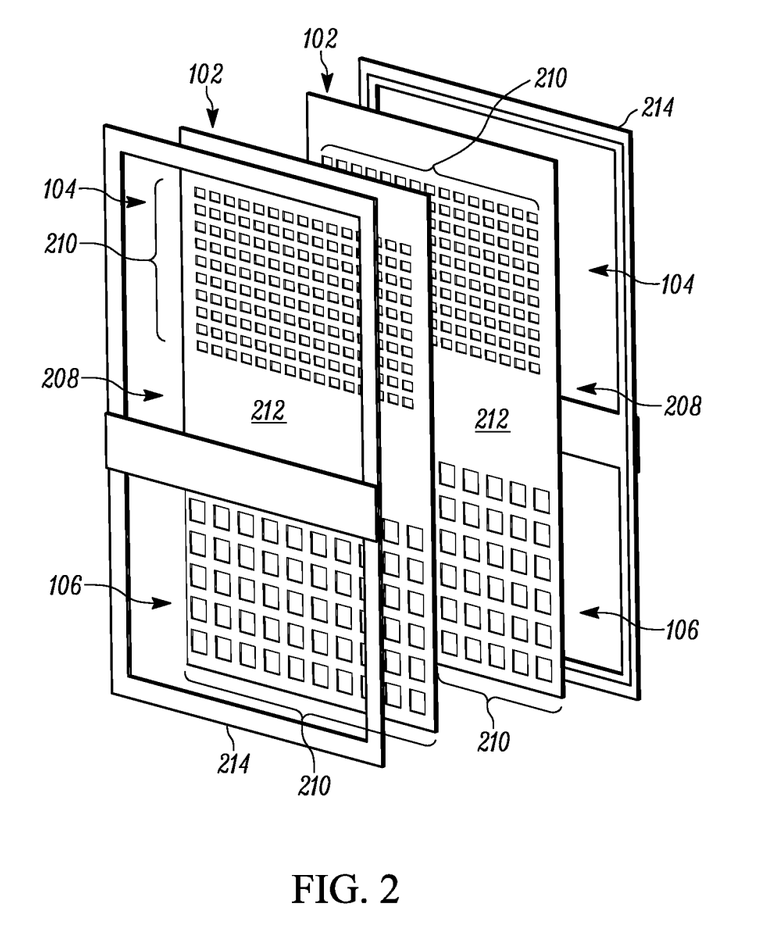
FIG. 2 is an exploded perspective view of a component of the aspect of FIG. 1.

The circuit card subassemblies 104 and 106 could comprise, as in the example shown in FIG. 2, two longitudinally spaced groups of IC chips 210 mounted on a single backing substrate 212, with each "subassembly" being defined as a predetermined area of the backing substrate 212 surface. This is the arrangement which will be used as an example in the Figures and corresponding description, with the first and second circuit card subassemblies 104 and 106 and card connector 208 being a unitary construct. (The term "unitary construct" is used herein to indicate that the first and second circuit card subassemblies 104 and 106 and card connector 208 are formed from a single piece of material, with the delineation between these components being based upon their relative positions on that single piece of material.)

Additionally or alternatively, one or both of the first and second circuit card subassemblies 102 and 104 could comprise at least one IC chip 210 mounted on a subassembly substrate (not shown). The subassembly substrate (before or after the IC chips 210 are mounted thereon) may then be, in turn, mounted on a backing substrate 212 to achieve the desired longitudinal spacing for the first and second circuit card subassemblies 104 and 106.

One example of a suitable circuit card 102 is provided in U.S. Pat. No. 9,648,749, issued 9 May 2017 and entitled "CIRCUIT CARD ASSEMBLY AND METHOD OF PROVIDING SAME", incorporated herein by reference in its entirety. The presence of the circuit card 102, or portions thereof, may help to restrict at least one of magnetic, thermal, and radiation transmission longitudinally between the IC chips 210 of the first and second circuit card subassemblies 104 and 106. For example, the backing substrate 212 could act in a heat shielding and electro-magnetic interference ("EMI") shielding capacity. (Here, EMI shielding should be understood to include, but not be limited to, DC magnetic shielding, such as by using any desirable high magnetic permeability materials.)

In other words, the first and second circuit card subassemblies 104 and 106 may be connected together by a laterally extending card connector 208 (shown and described herein as being the backing substrate 212) oriented in a parallel and/or coincident lateral-longitudinal plane to the first and second circuit card subassemblies 104 and 106. As in the arrangement of at least FIGS. 1-2, each circuit card subassembly 104 and 106 may include a plurality of IC chips 210 extending transversely from the card connector 208 (here, backing substrate 212). (The transverse direction is substantially into and out of the plane of the paper in the orientation of FIG. 1, other than as tilted to allow for the perspective view).

The card connector 208 (e.g., the backing substrate 212) has a surface area larger than the combined surface area of the first and second circuit card subassemblies 104 and 106. Accordingly, the first and second circuit card subassemblies 104 and 106 may be spaced longitudinally apart, with a longitudinally intervening portion of the card connector 208, with the assistance of this disparity in relative surface areas. The card connector 208 may be a less thermally conductive area of the backing substrate 212 than is associated with either of the first and second circuit card subassemblies 104 and 106, which may assist in preventing parasitic heat transfer between the first and second circuit card subassemblies 104 and 106 in some use environments.

The IC chips 210 of a single circuit card 102 may have different temperature requirements. For example, the longitudinally topmost (in the orientation of the Figures) array of IC chips 210 (e.g., those of the first circuit card subassembly 104) could have a desired operating temperature in the range of about 75-79K, such as about 77 K. Similarly, the longitudinally bottommost (in the orientation of the Figures) array of IC chips 210 (e.g., those of the second circuit card subassembly 106) could have a desired operating temperature in the range of about 2-6K, such as about 4 K. As described below, the apparatus 100 can help provide a desired temperature-differential environment for the first and second circuit card subassemblies 104 and 106, and the backing substrate 212 can assist with thermal efficiency by blocking, among other energies, thermal energy transfer longitudinally between the first and second circuit card subassemblies 104 and 106.

Stated differently, two longitudinally adjacent first and second circuit card subassemblies 104 and 106 can be maintained (via their inclusion in the apparatus 100) in close spatial proximity to each other, each at a different temperature, with low thermal parasitic heat transfer between first and second circuit card subassemblies 104 and 106 due to at least one of the cooling structures and facilities described herein and the presence of a portion of the backing substrate 212 longitudinally between the first and second circuit card subassemblies 104 and 106.

FIG. 2 depicts one example arrangement of a pair of opposed circuit cards 102 arranged for use in the apparatus 100, in exploded view. These circuit cards 102 (which are otherwise substantially the same as one another) are placed back-to-back. That is, transversely adjacent circuit cards 102 can be alternately oriented in different transverse directions, as desired for a particular use environment. This back-to-back placement may be provided to assist with packaging density, support configuration, fluid flow, or for any other reason. The transversely adjacent and oppositely facing pairs of circuit cards 102, when present as shown in FIG. 2, may be supported by the presence of one or more frames 214 (two shown) to provide structural support, particularly when the circuit cards 102 are thin enough that such support is warranted. In some use environments, the frames 214 may hold the circuit cards 102 in close enough proximity to substantially eliminate open space transversely between the circuit cards 102 in each "pair".

Figure 3:
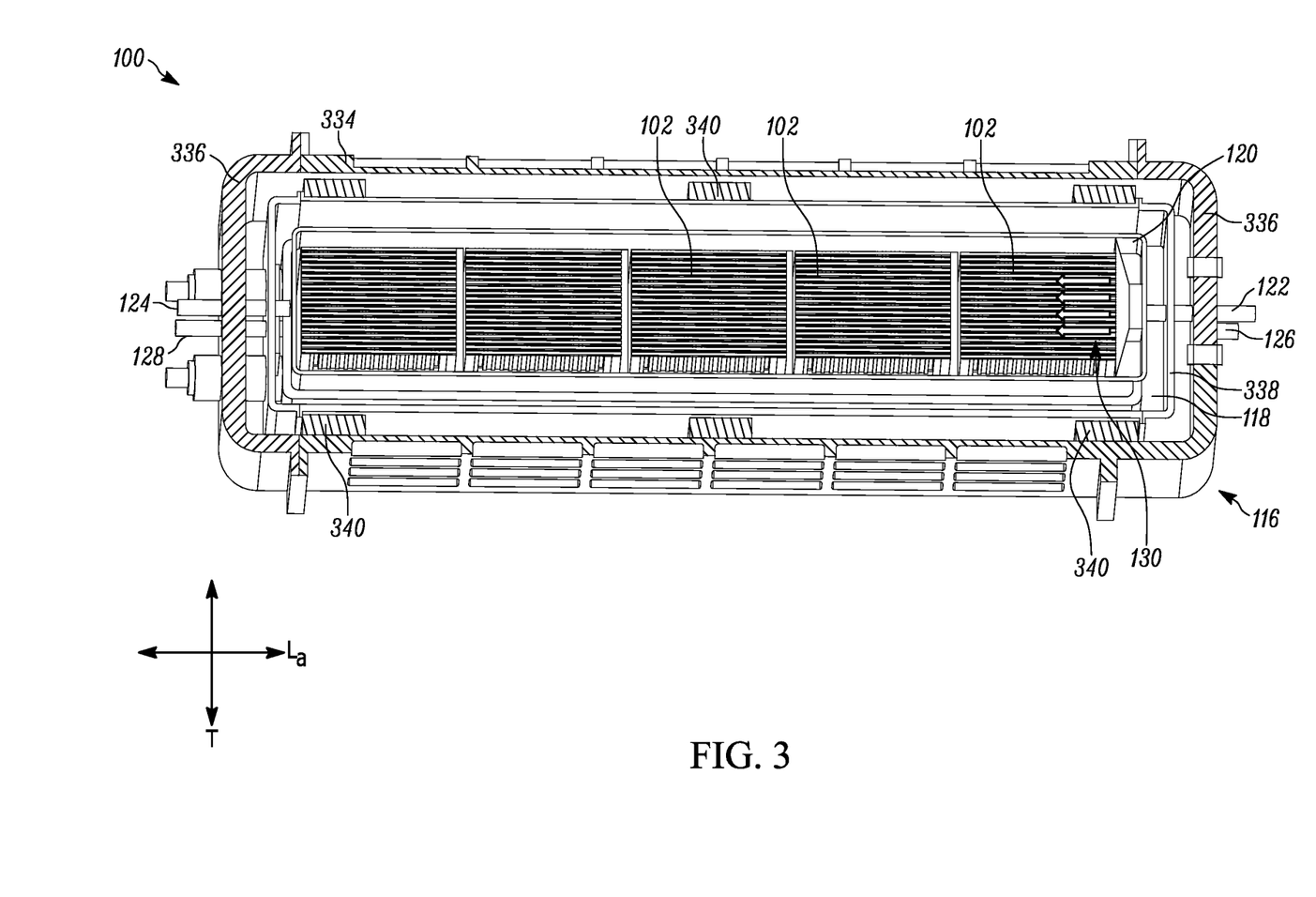
FIG. 3 is a schematic partial top view of the aspect of FIG. 1.
Figures 4, 5:
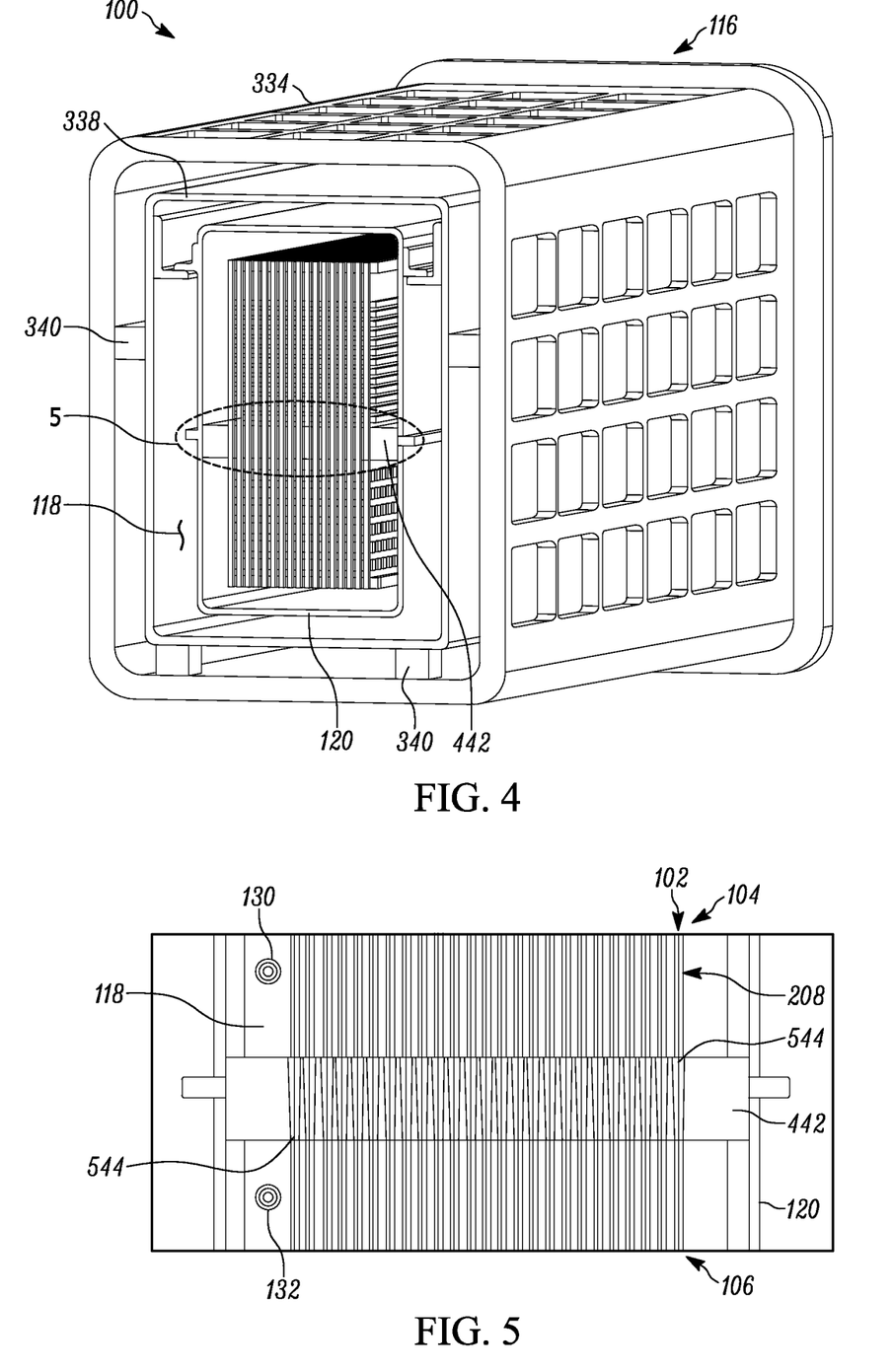
FIG. 4 is a schematic partial side view of the aspect of FIG. 1.
FIG. 5 is a magnified view of detail "5" of FIG. 4.

With reference back to FIG. 1, the apparatus 100 also includes a housing 116 defining a housing internal volume 118 which completely three-dimensionally surrounds the circuit card 102. As depicted in the Figures, the housing 116 could be assembled from multiple subcomponents. A plurality of circuit cards 102 may be located inside the housing internal volume 118, as shown. In many use environments, each of the plurality of circuit cards 102 may be oriented substantially in a lateral-longitudinal plane, as shown in FIGS. 1 and 3-4. Also as shown in FIGS. 1 and 3-4, the plurality of circuit cards 102 may be located in at least one of a laterally stacked row arrangement and a transversely stacked column arrangement. Both "rows" and "columns" of this type are present in the apparatus 100 shown in the Figures and described herein. The housing internal volume 118 may be at least partially under vacuum, which, when present, could assist with avoiding unwanted heat transfer within the housing internal volume 118 and thus produce thermal isolation.

The housing 116 may include an inner container 120, as shown in the Figures. When present, the inner container 120 may be located in the housing internal volume 118 and completely surround the circuit card(s) 102 for any desired purpose such as, but not limited to, isolating the circuit card(s) 102 from apertures or ports in the housing 118 and/or establishing (and/or maintaining) an evacuated vacuum ambient space around the circuit card(s) 102.

The first and second circuit card subassemblies 104 and 106, as previously mentioned, may have first and second operating temperatures, respectively. The first and second operating temperatures are different from one another. In order to support the maintenance of the first and second operating temperatures, the housing 116 includes first temperature inlet and outlet couplings 122 and 124, respectively, and second temperature inlet and outlet housings 126 and 128, respectively. More specifically, a first temperature inlet coupling 122 is provided for routing a first temperature-control fluid into the housing 116. The first temperature inlet coupling 122 is laterally aligned with the first circuit card subassembly 104. (The term "laterally aligned with" is used herein to indicate that at least a portion of the "laterally aligned" structures are located on a common laterally oriented line. However, "laterally aligned" structures could be offset from one another in other orthogonal directions, such as longitudinal and/or transverse.) The first temperature outlet coupling 124 is provided for routing the first temperature-control fluid out of the housing 116. The first temperature outlet coupling 124 is laterally aligned with the first circuit card subassembly 104 and is longitudinally spaced upon the housing 116 from the first temperature inlet coupling 122. The second temperature inlet coupling 126 is provided for routing a second temperature-control fluid into the housing 116. The second temperature inlet coupling 126 is laterally aligned with the second circuit card subassembly 106. The second temperature outlet coupling 128 is provided for routing the second temperature-control fluid out of the housing 116. The second temperature outlet coupling 128 is laterally aligned with the second circuit card subassembly 106 and is longitudinally spaced upon the housing 116 from the second temperature inlet coupling 126.

One of ordinary skill in the art can provide suitable locations, configurations, and other properties for the first temperature inlet and outlet couplings 122 and 124 and the second temperature inlet and outlet couplings 126 and 128, for a particular use environment of the apparatus 100. For example, as shown in the Figures, a chosen one (or both) of the first and second temperature inlet couplings 122 or 126 may be located on the housing 116 laterally opposite from a corresponding one (or both) of the first or second temperature outlet couplings 124 or 128. It is contemplated that any of the first temperature inlet and outlet couplings 122 and 124 and the second temperature inlet and outlet couplings 126 and 128 could be integrally formed with the housing 116 or could be separately provided. It is also contemplated that any of the first temperature inlet and outlet couplings 122 and 124 and the second temperature inlet and outlet couplings 126 and 128 could be flared (as shown in FIG. 3) or otherwise shaped to distribute and/or collect a corresponding first or second temperature-control fluid, or otherwise affect fluid dynamics characteristics. Any desired manifold or other fluid control mechanism or device could be provided as desired to produce the described fluid effects.

More specifically, the first temperature-control fluid is directed laterally from the first temperature inlet coupling 122 across at least a portion of the first circuit card subassembly 104 within the housing internal volume 118 in a first flow path (shown schematically at 130) to induce the first operating temperature concurrently with the second temperature-control fluid being directed laterally from the second temperature inlet coupling 126 across at least a portion of the second circuit card subassembly 106 within the housing internal volume 118 in a second flow path (shown schematically at 132) to induce the second operating temperature. The first and second temperature-control fluids thus flow across and "irrigate" or "bathe" the first and second circuit card subassemblies 104 and 106, respectively, to help remove waste heat from the IC chips 210 and other structures of the circuit card(s) 102. The first and second temperature-control fluids may be urged through the housing internal volume 118 under negative pressure from the outlet direction, and/or under positive pressure from the inlet direction. The first and second flow paths 130 and 132 within the housing internal volume 118 could be slightly below, equal to, or slightly above atmospheric pressure (the pressure outside the apparatus 100).

Any suitable fluid(s), in any phase(s) could be used as the first and/or second temperature-control fluids as suitable to achieve the desired first and second operating temperatures, and any desired structures could be provided to the apparatus 100 to facilitate the use of particular fluid(s). For example, a chosen one of the first and second temperature-control fluids may be in a liquid phase and the other one of the first and second temperature-control fluids may be in a gaseous phase, for certain use environments. (While "liquid" and "vapor" or "gaseous" are used here to indicate the majority of the fluid passing through these channels, it should be understood that the "liquid" channel could also include a minority proportion of vapor/gas, and vice versa). When such dual-phase cooling is provided, it is contemplated that the warmer of the first and second temperature-control fluids (normally the gaseous or vapor phase one) could be in the flow path located longitudinally higher within the housing 116 than the flow path for the cooler of the first and second temperature-control fluids (normally the liquid phase), for heat transfer efficiency or any other desired reason.

The first and second temperature-control fluids may be different phases of a single cooling fluid. For example, when the first operating temperature is about 77 K, the first temperature-control fluid could be gaseous-phase helium, at a temperature of about 60K; correspondingly, when the second operating temperature is about 4 K, the second temperature-control fluid could be liquid-phase helium, at a temperature of about 4 K. It is contemplated that a single quantity of cooling fluid could be passed through the housing 116 twice in some use environments—first through the second flow path as a liquid, and second through the first flow path as a vapor/gas, after that particular cooling fluid has undergone a phase change (which may be at least partially due to absorbed heat from the second flow path).

Figure 6:
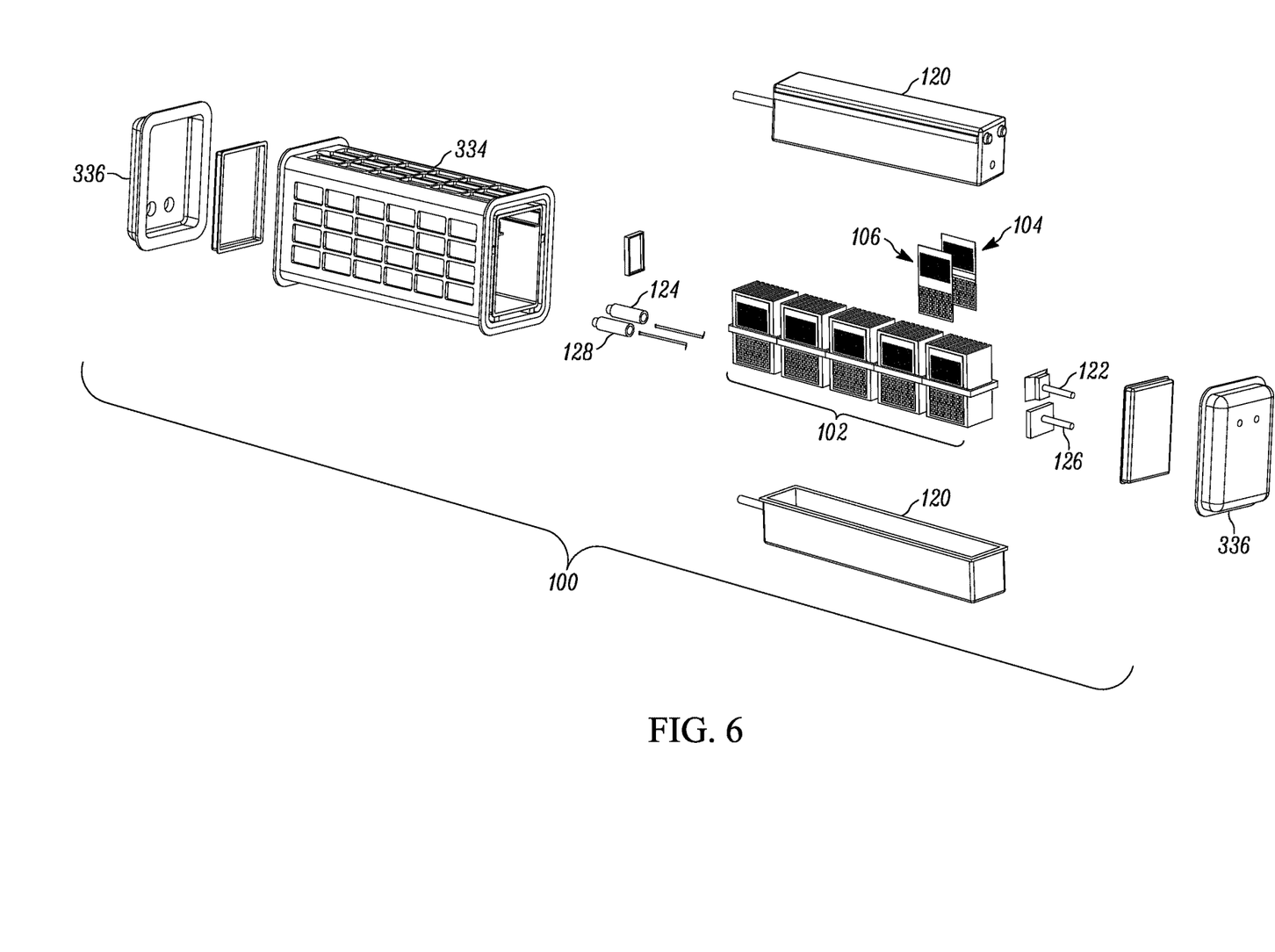
FIG. 6 is an exploded perspective view of the aspect of FIG. 1.
Figure 7:
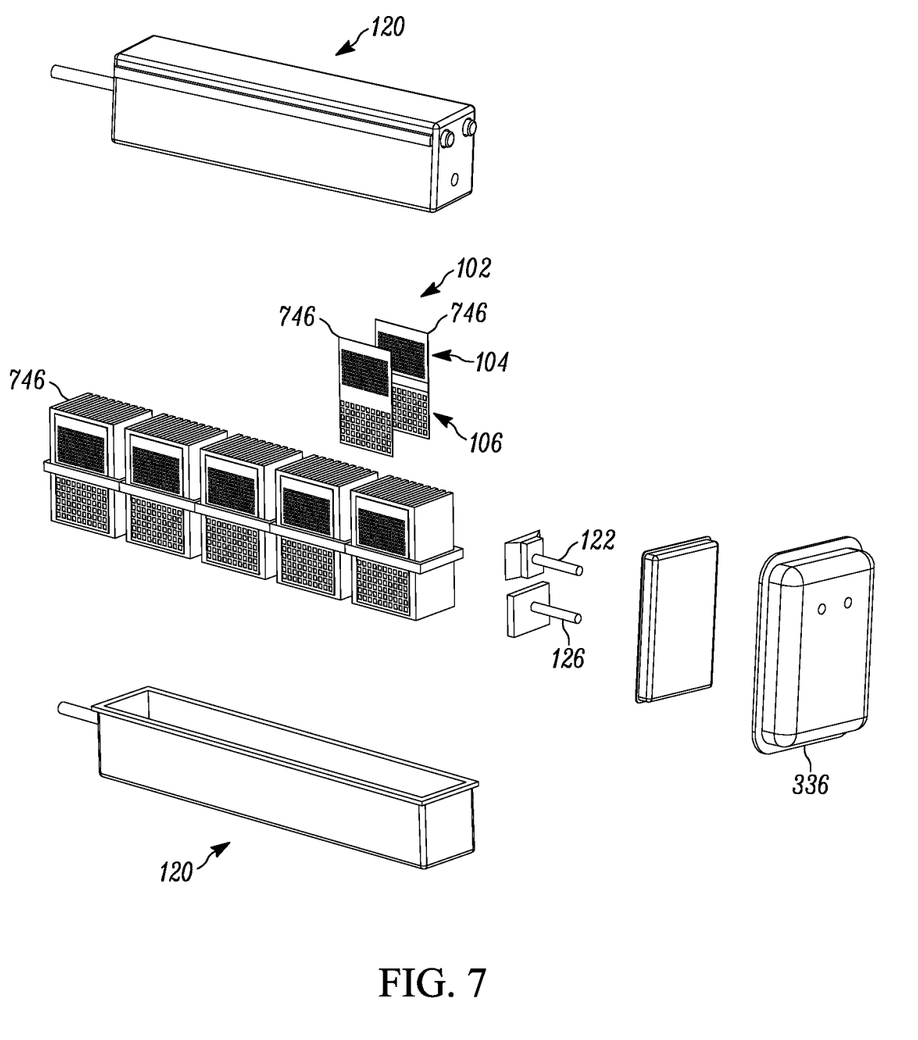
FIG. 7 is a partial exploded perspective view of the aspect of FIG. 1.

Referring to FIGS. 3-4, details of the housing 116 are shown. The housing 116 may be assembled from separate housing body 334 and housing endcap 336 parts, as shown. In addition to, or instead of, the inner container 120, one or more thermal shield(s) 338 could be provided, to further assist with providing a desired thermal environment inside at least a portion of the housing inner volume 118. Any desired flange(s), seal(s), and/or spacers 340 (which may be non-conductive spacers 340) could be provided to aid the assembly and/or operation of the apparatus 100, in either or both of thermal and mechanical senses, with several such components shown in the exploded views of FIGS. 6-7. As shown in FIGS. 6-7 with respect to the inner container 120, certain components may be made of multiple subcomponents attached together—in such cases, the seams or joins of those subcomponents could be sealed in any desired manner, and may be configured (e.g., offset from one another) to reduce unwanted potential thermal flow paths.

In many use environments, the first and second flow paths 130 and 132 may be substantially separate from one another, as shown in FIG. 1. By "substantially separate", it is meant that only a de minimis amount of mixture, insufficient to materially change the temperature of one or more of the first and second temperature-control fluids, occurs at the boundary between the first and second flow paths 130 and 132. This may particularly be the case when the first and second temperature-control fluids have different phases. The first and second flow paths 130 and 132, when substantially separate from one another, may also be substantially parallel, again as shown in FIG. 1.

Any desired separation of the first and second flow paths 130 and 132 could be accomplished via fluid dynamics configuration within the housing internal volume 118. Alternately, a thermal barrier 442, shown in detail in FIGS. 4-5, may be located within the housing internal volume 118 transversely adjacent at least a portion of the card connector 208. The thermal barrier 442, when present, at least partially restricts fluid flow longitudinally between the first and second circuit card subassemblies 104 and 106. In other words, the thermal barrier 442 may substantially longitudinally separate the first and second flow paths 130 and 132 (shown schematically head-on in FIG. 5). As shown in FIGS. 4-5, the thermal barrier 442 could be shaped to interdigitate transversely with a transversely stacked column of circuit cards 102, such as by including slots 544 through which the circuit cards 102 extend. (In the depicted arrangement, the thermal barrier 442 is configured to fully span the transverse dimension within the inner container 120 between laterally adjacent columns of circuit cards 102, to prevent fluid flow from traveling between the first and second flow paths 130 and 132.) As is apparent in FIG. 5, the slots 544 may be wedge-shaped when viewed in a transverse-longitudinal plane cross-section, which may assist with providing a sealing fit in conjunction with the circuit cards 102 and/or any frames 214 associated therewith.

In a configuration where the first and second temperature-control fluids are different fluids, the thermal barrier 442 could include a hermetic seal (not shown) in order to help keep the first and second temperature-control fluids entirely separate. In contrast, when the first and second temperature-control fluids are the same type of fluid (which can be in the same or different phases in the first and second flow paths 130 and 132), the thermal barrier 442 may allow portions of evaporated fluid from the first flow path 130 to pass directly through the thermal barrier 442 to the second flow path 132. In this case of same-fluid cooling, a hermetic seal—which may be expensive to provide—is not needed with the thermal barrier 442.

Turning to FIG. 7, a data link 746 (e.g., a fiber optic data link 746) may be provided to facilitate electrical communication within or to/from the apparatus 100. The data links 746 of the plurality of circuit cards 102 could be aggregated within, or outside the housing 116 as desired. As shown schematically in FIG. 1, at least one electrical interconnect 148 can extend through the housing 116 from a selected one (or a plurality) of the first and second circuit card subassemblies 104 and 106 to place the selected circuit card subassembly 104 and/or 106 in electrical communication with an electrical device 150 outside the housing 116, for the exchange of data, power, or any other desired electrical signal(s). The data links 746 from a plurality of circuit card 102, as previously mentioned, could be aggregated into a single electrical interconnect 148. The electrical interconnect 148 is shown schematically in FIG. 1 as incorporating both wired and wireless communication schemes, and one of ordinary skill in the art can provide an apparatus 100 with any desired wired and/or wireless electrical communication facilities for a particular use environment.

Figure 8:
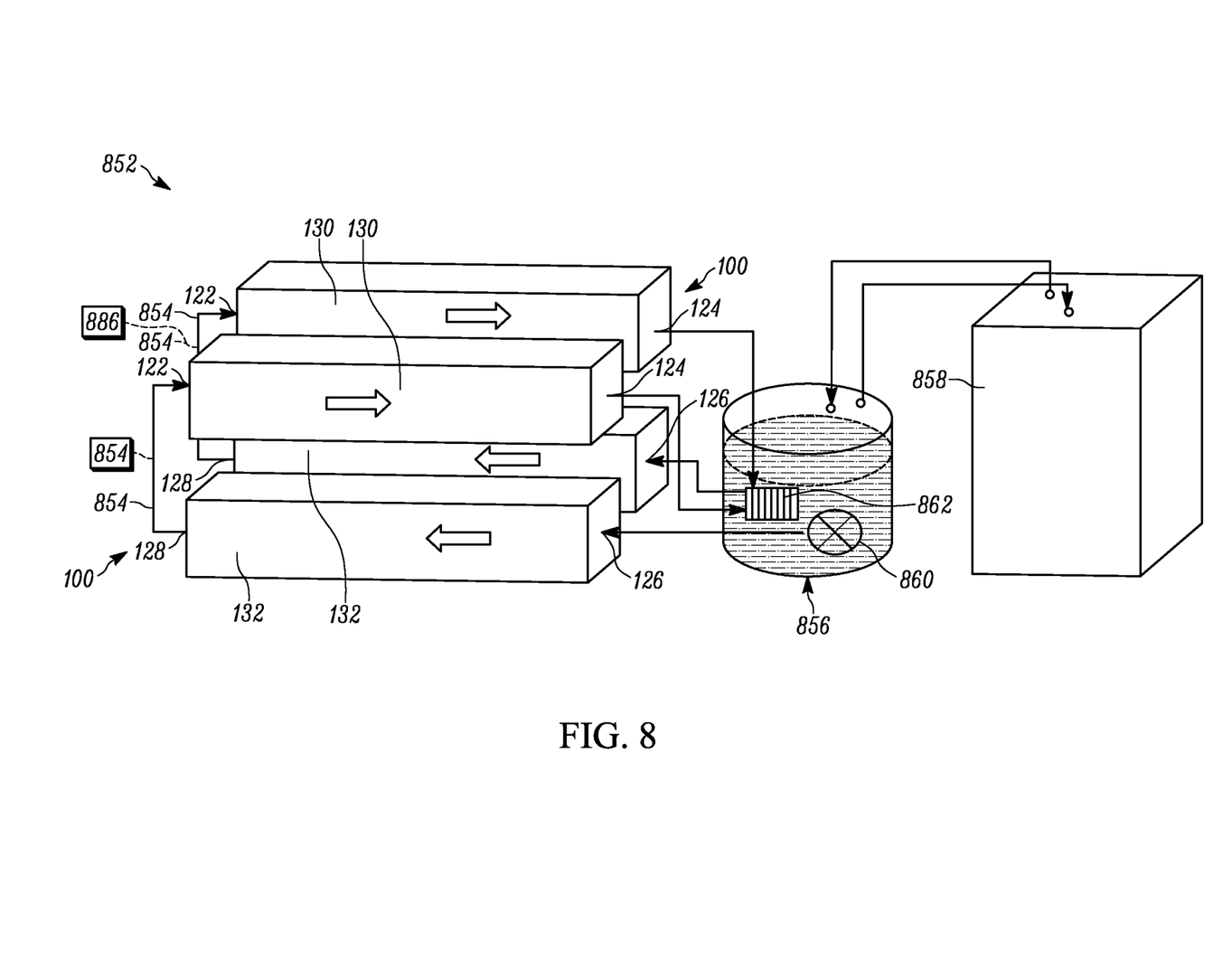
FIG. 8 is a schematic view of a system including the aspect of FIG. 1.

With reference now to the schematic depiction of FIG. 8, a system 852 could be provided including a plurality of apparatuses 100 as previously described. For the sake of description, the apparatuses 100 are shown in FIG. 8 as being reduced to the first and second flow paths 130 and 132. In the system 852, a first temperature-control fluid source 854 is in fluid communication with at least one first temperature inlet coupling 122 of each apparatus 100. A second temperature-control fluid source 856 (here, a liquid cooling fluid tank 856) is in fluid communication with at least one second temperature inlet coupling 126 of each apparatus 100. A refrigeration system 858 could be provided to keep the fluid in the liquid cooling fluid tank 856 at a desired temperature. A pump 860 could be provided to assist with routing and directing the first and/or second temperature-control fluids along the first and second flow paths 130 and 132.

In the system 852 shown in FIG. 8, the first and second flow paths 130 and 132 run in opposite directions, to support the use of a liquid phase of a single cooling fluid in the second flow path 130 as the second temperature-control fluid and then a gaseous/vapor phase of that same cooling fluid in the first flow path 132 as the first temperature-control fluid. Accordingly, the second temperature outlet coupling 128 of each apparatus 100 is routed directly to the first temperature inlet coupling 122 of that same apparatus 100, and that routing serves as a first temperature-control fluid source 854. As shown in dashed line in FIG. 8, an outside temperature-control fluid source 854 could be provided, to supplement or supplant any routing of fluid between the first and second flow paths 130 and 132. The "used" second temperature-control fluid can be returned from the first temperature outlet couplings 124 to the second temperature-control fluid source 856 for reuse once cooled back down to the temperature of the first temperature-control fluid (e.g., via heat exchanger 862).

It is contemplated, though, that—instead of the arrangement shown in the system 852 of FIG. 8, the first and second temperature-control fluids could be provided separately—from two separate cooling sources or different phases of a single cooling source—without a "double-use" of the same fluid as shown in this Figure. It is also or instead contemplated that there could be a cooling booster unit (shown schematically as 886 in FIG. 8) provided in the fluid path between the outlet coupling of one flow path and the inlet coupling of another flow path (on the same or a different apparatus 100, and for the same or the other of the first and second temperature-control fluids), to assist with achieving desired temperatures within a single apparatus 100 and/or a system 852. Using one apparatus 100 or a system 852 of apparatuses 100, regardless of configuration, the circuit cards 102 can be cooled through application of first and second temperature-control fluids in order to support dual-temperature computing systems.

Figure 9:
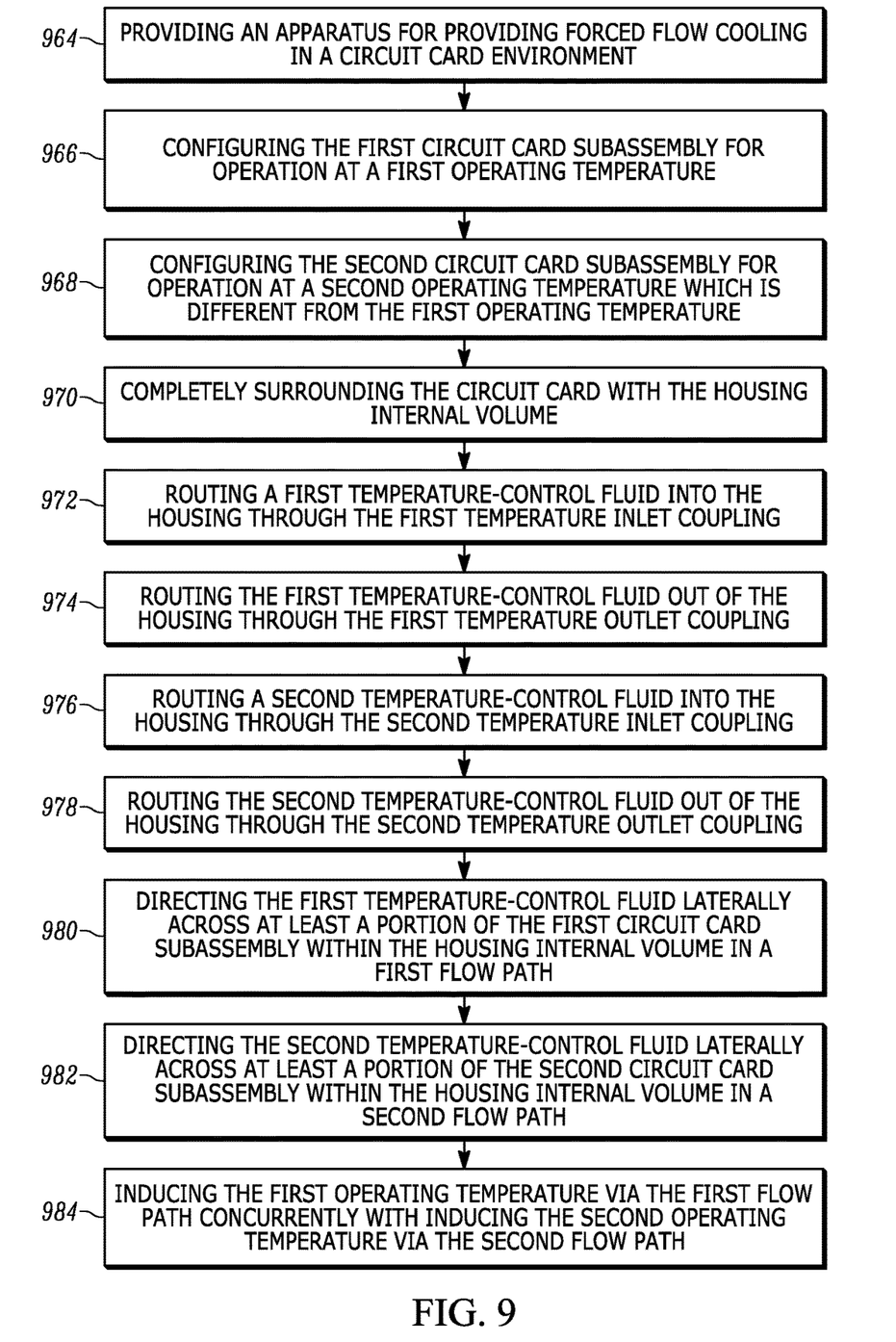
FIG. 9 is a flowchart of an example method including the aspect of FIG. 1.

FIG. 9 is a flowchart of some example steps of a method of providing forced flow cooling in a circuit card 102 environment using an apparatus 100 as described above and shown in the Figures. In first action block 964, the apparatus 100 is provided. The method then moves to second action block 966, where the first circuit card subassembly 104 is configured for operation at a first operating temperature. In third action block 968, the second circuit card subassembly 106 is configured for operation at a second operating temperature which is different from the first operating temperature. The circuit card 108 is completely surrounded with the housing internal volume 118 in fourth action block 970.

Control then proceeds to fifth action block 972, where a first temperature-control fluid is routed into the housing 116 through the first temperature inlet coupling 122. The first temperature-control fluid is then routed out of the housing 116 through the first temperature outlet coupling 124 in sixth action block 974. Similarly, in seventh action block 976, a second temperature-control fluid is routed into the housing 116 through the second temperature inlet coupling 126. The second temperature-control fluid is then routed out of the housing 116 through the second temperature outlet coupling 128 in eighth action block 978. As previously mentioned, it is contemplated that a chosen one of the first and second temperature-control fluids could be provided in a liquid phase and the other one of the first and second temperature-control fluids could be provided in a gaseous/vapor phase.

In ninth action block 980, the first temperature-control fluid is directed laterally across at least a portion of the first circuit card subassembly 104 within the housing internal volume 118 in a first flow path 130. In tenth action block 982, the second temperature-control fluid is directed laterally across at least a portion of the second circuit card subassembly 106 within the housing internal volume 118 in a second flow path 132. As mentioned above, fluid flow longitudinally between the first and second circuit card subassemblies could be at least partially restricted, such as through the use of a thermal barrier 442 or other physical flow impediment.

While the steps of FIG. 9 can occur in any desired sequence, timing, and configuration, it should be particularly noted that the action of fifth through tenth action blocks 972-982 could occur concurrently and/or in a continuous, cycle-like manner to assist with providing suitable first and second flow paths 130 and 132 for a particular use environment.

To complete the example method in FIG. 9, in eleventh action block 984, the first operating temperature is induced via the first flow path concurrently with the second operating temperature being induced via the second flow path. As a result, the method of FIG. 9 can be used to operate an apparatus 100 and/or system 852 to provide desired temperature-control features for a dual-temperature circuit card 102 computing environment.

It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "directly adjacent" another feature may have portions that overlap or underlie the adjacent feature, whereas a structure or feature that is disposed "adjacent" another feature may not have portions that overlap or underlie the adjacent feature.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms can encompass different orientations of a device in use or operation, in addition to the orientation depicted in the figures. For example, if a device in the figures is inverted, elements described as "under" or "beneath" other elements or features would then be oriented "over" the other elements or features.

It will be understood that, although the terms "first," "second," etc. may be used herein to describe various elements, these elements should not be limited by these terms. These terms are only used to distinguish one element from another. Thus, a "first" element discussed below could also be termed a "second" element without departing from the teachings of the present disclosure. The sequence of operations (or steps) is not limited to the order presented in the claims or figures unless specifically indicated otherwise.

While aspects of this disclosure have been particularly shown and described with reference to the example embodiments above, it will be understood by those of ordinary skill in the art that various additional embodiments may be contemplated. For example, the specific methods described above for using the apparatus are merely illustrative; one of ordinary skill in the art could readily determine any number of tools, sequences of steps, or other means/options for placing the above-described apparatus, or components thereof, into positions substantively similar to those shown and described herein. Though cooling is used herein as a temperature control example, one of ordinary skill in the art could providing heating using the apparatus 100 and/or system 852 described herein, or substantially similar constructs thereto. Any of the described actions can occur in any desired combination(s) and sequence(s), and one or more of the actions can repeat any desired number of times during operation of the apparatus 100. Any of the described structures and components could be integrally formed as a single unitary or monolithic piece or made up of separate subcomponents, with either of these formations involving any suitable stock or bespoke components and/or any suitable material or combinations of materials. Any of the described structures and components could be disposable or reusable as desired for a particular use environment. Any component could be provided with a user-perceptible marking to indicate a material, configuration, at least one dimension, or the like pertaining to that component, the user-perceptible marking aiding a user in selecting one component from an array of similar components for a particular use environment. A "predetermined" status may be determined at any time before the structures being manipulated actually reach that status, the "predetermination" being made as late as immediately before the structure achieves the predetermined status. Though certain components described herein are shown as having specific geometric shapes, all structures of this disclosure may have any suitable shapes, sizes, configurations, relative relationships, cross-sectional areas, or any other physical characteristics as desirable for a particular application. Any structures or features described with reference to one embodiment or configuration could be provided, singly or in combination with other structures or features, to any other embodiment or configuration, as it would be impractical to describe each of the embodiments and configurations discussed herein as having all of the options discussed with respect to all of the other embodiments and configurations. A device or method incorporating any of these features should be understood to fall under the scope of this disclosure as determined based upon the claims below and any equivalents thereof.

Other aspects, objects, and advantages can be obtained from a study of the drawings, the disclosure, and the appended claims.

We claim:

1. An apparatus for providing forced flow cooling in a circuit card environment, the apparatus comprising:
    at least one circuit card including first and second longitudinally spaced circuit card subassemblies, connected together into a single circuit card oriented substantially in a lateral-longitudinal plane, the first and second circuit card subassemblies being connected together by a laterally extending card connector oriented in a parallel lateral-longitudinal plane to the first and second circuit card subassemblies, the first and second circuit card subassemblies having first and second operating temperatures, respectively, the first and second operating temperatures being different from one another;
    a housing defining a housing internal volume which completely three-dimensionally surrounds the circuit card;
    a first temperature inlet coupling for routing a first temperature-control fluid into the housing, the first temperature inlet coupling being laterally aligned with the first circuit card subassembly;
    a first temperature outlet coupling for routing the first temperature-control fluid out of the housing, the first temperature outlet coupling being laterally aligned with the first circuit card subassembly and longitudinally spaced upon the housing from the first temperature inlet coupling;
    a second temperature inlet coupling for routing a second temperature-control fluid into the housing, the second temperature inlet coupling being laterally aligned with the second circuit card subassembly;
    a second temperature outlet coupling for routing the second temperature-control fluid out of the housing, the second temperature outlet coupling being laterally aligned with the second circuit card subassembly and longitudinally spaced upon the housing from the second temperature inlet coupling;
    wherein the first temperature-control fluid is directed laterally across at least a portion of the first circuit card subassembly within the housing internal volume in a first flow path to induce the first operating temperature concurrently with the second temperature-control fluid being directed laterally across at least a portion of the second circuit card subassembly within the housing internal volume in a second flow path to induce the second operating temperature.

2. The apparatus of claim 1, including a thermal barrier located within the housing internal volume transversely adjacent at least a portion of the card connector, the thermal barrier at least partially restricting fluid flow longitudinally between the first and second circuit card subassemblies.

3. The apparatus of claim 1, including a plurality of circuit cards located inside the housing internal volume, each of the plurality of circuit cards being oriented substantially in a lateral-longitudinal plane.

4. The apparatus of claim 3, wherein a plurality of circuit cards are located in at least one of a laterally stacked row arrangement and a transversely stacked column arrangement.

5. The apparatus of claim 3, wherein transversely adjacent circuit cards are alternately oriented in different transverse directions.

6. The apparatus of claim 1, wherein the first and second circuit card subassemblies and card connector are a unitary construct.

7. The apparatus of claim 1, wherein the housing internal volume is at least partially under vacuum.

8. The apparatus of claim 1, wherein a chosen one of the first and second temperature inlet couplings is located on the housing laterally opposite from a corresponding first or second temperature outlet coupling.

9. The apparatus of claim 1, wherein a chosen one of the first and second temperature-control fluids is in a liquid phase and the other one of the first and second temperature-control fluids is in a gaseous phase.

10. The apparatus of claim 9, wherein the first and second temperature-control fluids are different phases of a single cooling fluid.

11. The apparatus of claim 1, wherein the first and second flow paths are substantially separate from one another.

12. The apparatus of claim 11, wherein the first and second flow paths are substantially parallel.

13. The apparatus of claim 11, including a thermal barrier located within the housing internal volume transversely adjacent at least a portion of the card connector, the thermal barrier substantially longitudinally separating the first and second flow paths.

14. The apparatus of claim 1, including at least one electrical interconnect extending through the housing from a selected one of the first and second circuit card subassemblies to place the selected circuit card subassembly in electrical communication with an electrical device outside the housing.

15. The apparatus of claim 1, wherein each circuit card subassembly includes a plurality of IC chips extending transversely from at least one of a circuit board including the card connector and a subassembly substrate, each subassembly substrate, when present, being transversely mounted on the card connector, the card connector having a surface area larger than the combined surface area of the subassembly substrates of the first and second circuit card subassemblies.

16. The apparatus of claim 1, including a cooling booster unit provided in the fluid path between a chosen one of the first and second outlet coupling and a chosen one of the first and second inlet couplings.

17. A system including:
a plurality of apparatuses according to claim 1;
a first temperature-control fluid source in fluid communication with at least one first temperature inlet coupling of each apparatus; and
a second temperature-control fluid source in fluid communication with at least one second temperature inlet coupling of each apparatus.

18. A method of providing forced flow cooling in a circuit card environment, the method comprising:
providing an apparatus including:
at least one circuit card including first and second longitudinally spaced circuit card subassemblies, connected together into a single circuit card oriented substantially in a lateral-longitudinal plane, the first and second circuit card subassemblies being connected together by a laterally extending card connector oriented in a parallel lateral-longitudinal plane to the first and second circuit card subassemblies,
a housing defining a housing internal volume,
a first temperature inlet coupling being laterally aligned with the first circuit card subassembly,
a first temperature outlet coupling being laterally aligned with the first circuit card subassembly and longitudinally spaced upon the housing from the first temperature inlet coupling,
a second temperature inlet coupling being laterally aligned with the second circuit card subassembly, and
a second temperature outlet coupling being laterally aligned with the second circuit card subassembly and longitudinally spaced upon the housing from the second temperature inlet coupling;
configuring the first circuit card subassembly for operation at a first operating temperature;
configuring the second circuit card subassembly for operation at a second operating temperature which is different from the first operating temperature;
completely surrounding the circuit card with the housing internal volume;
routing a first temperature-control fluid into the housing through the first temperature inlet coupling;
routing the first temperature-control fluid out of the housing through the first temperature outlet coupling;
routing a second temperature-control fluid into the housing through the second temperature inlet coupling;
routing the second temperature-control fluid out of the housing through the second temperature outlet coupling;
directing the first temperature-control fluid is laterally across at least a portion of the first circuit card subassembly within the housing internal volume in a first flow path;
directing the second temperature-control fluid laterally across at least a portion of the second circuit card subassembly within the housing internal volume in a second flow path; and
inducing the first operating temperature via the first flow path concurrently with inducing the second operating temperature via the second flow path.

19. The method of claim 18, including at least partially restricting fluid flow longitudinally between the first and second circuit card subassemblies.

20. The method of claim 18, including providing a chosen one of the first and second temperature-control fluids in a liquid phase and the other one of the first and second temperature-control fluids in a gaseous phase.

21. The method of claim 18, wherein providing an apparatus includes:
locating a plurality of circuit cards inside the housing internal volume;
orienting each of the plurality of circuit cards substantially in a lateral-longitudinal plane; and
locating the plurality of circuit cards within the housing in at least one of a laterally stacked row arrangement and a transversely stacked column arrangement.

* * * * *